United States Patent [19]

Ahlert et al.

[11] Patent Number: 5,492,775
[45] Date of Patent: Feb. 20, 1996

[54] BARIUM FERRITE THIN FILM FOR LONGITUDINAL RECORDING

[75] Inventors: Richard H. Ahlert, San Jose; James K. Howard, Morgan Hill; Todd L. Hylton, San Jose; Michael A. Parker, Fremont; Muhammad I. Ullah, Morgan Hill, all of Calif.

[73] Assignee: International Business Machines Corporation, Armonk, N.Y.

[21] Appl. No.: 69,060

[22] Filed: May 28, 1993

[51] Int. Cl.$^6$ ........................................... G11B 5/66
[52] U.S. Cl. ................... 428/694 T; 428/694 TR
[58] Field of Search ............ 428/694 T, 694 TR; 360/135, 103; 204/192.15, 192.2; 427/130

[56] References Cited

U.S. PATENT DOCUMENTS

| | | | |
|---|---|---|---|
| 4,438,066 | 3/1984 | Aboaf et al. | 420/435 |
| 4,792,497 | 12/1988 | Suzuki et al. | 428/336 |
| 4,816,292 | 3/1989 | Machida | 427/38 |
| 5,034,243 | 7/1991 | Chiba et al. | 427/48 |
| 5,084,152 | 1/1992 | Lin | 204/192.15 |
| 5,094,896 | 3/1992 | Morita et al. | 428/64 |
| 5,227,204 | 7/1993 | Vittoria | 427/596 |

FOREIGN PATENT DOCUMENTS

| | | | |
|---|---|---|---|
| 187169 | 12/1984 | European Pat. Off. | G11B 5/84 |
| 435159 | 12/1990 | European Pat. Off. | G11B 5/712 |
| 443478 | 2/1991 | European Pat. Off. | G11B 5/64 |
| 60-101721 | 6/1985 | Japan | G11B 5/84 |
| 2016528 | 2/1979 | United Kingdom | C23C 15/00 |
| 2245599 | 10/1990 | United Kingdom | G11B 5/84 |
| 2254620 | 3/1992 | United Kingdom | C23C 14/58 |

OTHER PUBLICATIONS

Gerard et al., "Crystallization Phenomena in Thin Films of Amorphous Barium Hexaferrite", Solid State Communications, vol. 71, No. 1, pp. 57–62, 1989.

X. Sui et al. "Magnetic easy axis randomly in-plane oriented barium hexaferrite thin film media", Technical Report #98–08, Data Storage Systems Center, Apr. 23, 1993.

M. Matsuoka et al., "Ba-ferrite thin-film disk for perpendicular magnetic recording", J. Appl. Phys. 57(1), pp. 4040–4042, Apr. 1985.

M. Matsuoka et al., "Preparation of Ba-Ferrite Films for Perpendicular Magnetic Recording by RF Targets Facing Type of Sputtering", IEEE Trans. on Magnetics, vol. MAG-20, No. 5, pp. 800–802, Sep. 1984.

*Primary Examiner*—Paul J. Thibodeau
*Attorney, Agent, or Firm*—James C. Wilson

[57] ABSTRACT

A high-density recording media comprising longitudinally oriented polycrystalline barium ferrite exhibits large coercivity, corrosion resistance, high hardness and durability. Films are prepared by on-axis sputtering at ambient temperatures from stoichiometric targets followed by a post-deposition anneal at approximately 850°C. to induce crystallization. Crystallization yields a magnetic film with large in-plane remanence and a fine scale texturing that greatly improves the tribological performance of barium ferrite disks. Exceptional durability can be achieved on disks without overcoats. Grain sizes as small as 200 Å are produced by doping with small amounts of $Cr_2O_3$ or other additives. Coercivities greater than 4000 Oe are achieved even in small grain films.

7 Claims, 10 Drawing Sheets

BARIUM FERRITE THIN FILM FOR LONGITUDINAL RECORDING

TECHNICAL FIELD

This invention relates generally to magnetic recording media and, more particularly, to a barium ferrite thin film medium useful for longitudinal magnetic recording.

BACKGROUND

Barium ferrite compounds (compounds of barium, iron, and oxygen) have been widely studied because of their magnetic properties. One such compound is the magneto-plumbite phase, ($BaFe_{12}O_{19}$) which is frequently referred to as the M or M—Ba phase. The magneto-plumbite phase has hexagonal symmetry and is composed of layers of close-packed oxygen planes with iron atoms occupying several different interstitial sites and a barium atom substituting for oxygen on every fifth layer. The unit cell is composed of two formula units of $BaFe_{12}O_{19}$. The magnetic moments of the iron atoms at the interstitial sites are parallel to the crystallographic c-axis and partially compensate each other, leading to a ferrimagnetic state below the Curie temperature of approximately 450° C. At room temperature the material possesses large uniaxial crystal anisotropy and an easy magnetization axis parallel to the crystallographic c-axis. For fields applied parallel to the easy magnetization axis, coercivities larger than 6000 Oe have been reported in small single crystal particulates and nearly 5000 Oe has been achieved in thin films of the M phase.

Barium ferrite has been used as a magnetic recording medium in the form of single crystal particulates suspended in a binding material. The particulates in these media can be oriented by applying a magnetic field to the structure during the curing of the binder. The magnetic performance of barium ferrite particulate media is surprisingly close to that of a conventional thin film cobalt-alloy magnetic disk. The exceptional performance of this particulate media has been attributed to its large anisotropy field and the magnetic decoupling of the particulates. Nevertheless, in the drive toward higher density recording disks, the ability to make cobalt-based alloy media much thinner than particulate media has made it preferable for use as a recording medium.

Barium ferrite has also been investigated for use as a thin film perpendicular recording medium. Perpendicular recording media store information in the form of magnetized regions wherein the magnetization in each region is substantially perpendicular to the plane of the medium. This is in contrast to conventional longitudinal recording techniques wherein the magnetized regions have fields that lie substantially in the plane of the medium. Because the easy magnetization axis of barium ferrite is parallel to the c-axis, the prior art has been directed toward developing thin films with a high degree of c-axis perpendicular orientation. In addition to high coercivity, such films are advantageous because they are wear resistant and exhibit a high resistance to corrosion.

A favored preparation technique of perpendicular barium ferrite films is to sputter deposit barium ferrite from stoichiometric, ceramic targets in a system having two face-to-face targets onto a heated substrate located at the periphery of the plasma between the targets. This arrangement minimizes the bombardment of the thin film by energetic ions and electrons during film growth, thereby preventing changes in the film stoichiometry caused by the preferential re-sputtering of barium. Substrate temperatures during deposition range between 550° and 700° C. and sputtering gases are typically a few percent oxygen in argon at a total pressure of 2–8 millitorr.

While such films have desirable properties, they are of limited utility in longitudinal recording applications, which are often a preferred mode of magnetic recording. Longitudinal recording is preferred in many instances because of the relative ease with which high-performance read/write heads can be fabricated to work in conjunction with a longitudinal medium. The unsuitability of traditional barium ferrite thin films for such applications is due to their strong crystallographic and magnetic orientation perpendicular to the plane of the film. This results in an in-plane coercivity and an in-plane remanence that are far too low to be useful in high-performance recording applications.

For the foregoing reasons, there is a need for a thin film magnetic recording medium that utilizes the advantageous magnetic, structural, and chemical properties of thin film barium ferrite without the limitation of being strongly oriented perpendicular to the plane of the film.

SUMMARY OF THE INVENTION

The present invention is directed to a magnetic recording medium that satisfies this need by forming a barium ferrite thin film with a randomly oriented, fine-grained polycrystalline structure. Randomly oriented films of barium ferrite are obtained by room temperature sputter deposition of an amorphous oxide film followed by a high temperature annealing process in air or oxygen. The film which is non-magnetic and amorphous after deposition becomes magnetic and crystalline after annealing. The random orientation of the resultant barium ferrite crystals results in enough in-plane coercivity and remanence to make the medium useful for longitudinal recording.

A magnetic medium having features of the present invention comprises a barium ferrite film which has been sputter deposited at ambient temperatures from $BaFe_{12}O_{19}$ targets and then subjected to high temperature annealing to form a magnetic structure with random crystallization. The composition of the film is substantially $BaFe_{12}O_{19}$, a hexagonal. M-Ba ferrite compound. In one embodiment of the invention, annealing occurs when the film is subjected to 850° C. for 10 minutes in an atmosphere of oxygen. Much shorter annealing times are possible if the annealing occurs at a higher temperature. For example, in another embodiment of the invention, annealing occurs in 10 seconds at 950° C. Alternatively, the film can be annealed by laser irradiation so as to avoid subjecting the substrate to the damaging effects of high temperatures. One such embodiment subjects the film to irradiation by a 110 watt $CO_2$ laser operating at a wavelength of 10.6 microns for 80 seconds.

Typical magnetic properties for films prepared in accordance with the present invention are: $H_c$=2500–5000 Oe, $M_r$ t=1 memu/cm$^2$ for t=70 nm, $M_s$=375 emu/cc, ,S=0.55–0.65 and S*=.8. The large anisotropy of the material ($H_K$=17,000 Oe) is responsible for the large coercivity of these films and makes them difficult to saturate even with an applied field of 10,000 Oe. In addition, the resultant films have an inherent surface texture that is advantageous when the film is used for disk storage applications.

Another embodiment of the invention deposits, through sputtering, a thin film of barium ferrite while simultaneously doping the film with relatively small percentages of $Cr_2O_3$, $SiO_2$, $TiO_2$, $ZrO_2$, $Y_2O_3$, $Y_2O_3.ZrO_2$ (YSZ), $Al_2O_3$, CoO.TiO$_2$ or other oxides having a cation valence of +or +4. Thin films doped in this manner have a smaller grain size and therefore a higher signal to noise to ratio.

This invention thus provides a barium ferrite film with advantageous magnetic properties, corrosion resistance, durability and inherent texture without the limitation of being strongly magnetically oriented perpendicular to the plane of the film. Further features and advantages of the invention will become apparent from the following specification and the accompanying drawings.

DETAILED DESCRIPTION

Figure 1:
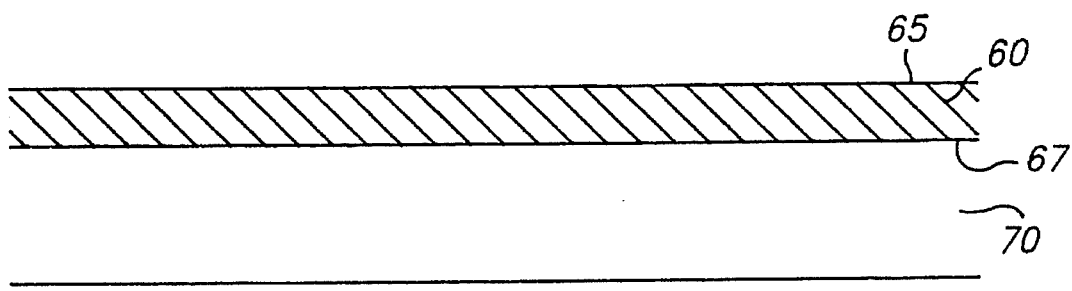
FIG. 1 is a cross-sectional view of a barium ferrite film on a substrate.

With reference to FIG. 1, a cross-sectional view of a barium ferrite film 60 deposited on a substrate 70 is illustrated. The film 60 has an upper surface 65 and a bottom surface 67 that forms the interface with substrate 70. The film 60 is deposited by reactive magnetron sputtering of a barium ferrite target in an on-axis sputtering system, such as the 24 inch Research S-gun model manufactured by Sputtered Films, Inc. of Santa Barbara, Calif. On-axis sputtering systems orient the sputtering target so as to be parallel to and facing the substrate. This configuration results in higher deposition rates than that achieved by sputtering systems which position a substrate perpendicular to the targets at the periphery of the plasma. The barium ferrite sputtering targets are stoichiometric or nearly stoichiometric, hot-pressed ceramics, which are insulating and magnetically unpolarized prior to sputtering. The films may be successfully sputtered under a wide range of conditions, including those indicated in Table I. Substrates remain at ambient temperature during deposition (typically 50° C.) and move with a continuous "planetary" motion over four different sputtering guns. Therefore, film deposition occurs only during that fraction of time when the substrates are over the barium ferrite target.

TABLE I

| | |
|---|---|
| Pressure | 2.5–8 mTorr |
| % O$_2$ in Argon | 1–10% |
| Flow | 40 sccm |
| Power | 200–500 W DC or RF |
| Negative Bias | 0–80 V DC |
| Thickness | 500–1100 Å |
| Rate | 8.5–11 Å/min |

Targets are initially sputtered with radio frequency (RF) power; however, after several hours of RF sputtering the targets become conductive and DC sputtering is possible. Target conductivity increases during the initial sputtering of a new target. This is likely the result of preferential sputtering at the target's surface. Target history has a large effect on the composition and properties of the sputtered barium ferrite films. For example, if deposition conditions are changed, the composition of the resultant films changes until the target again reaches a steady state. It is believed that the composite oxide target changes its surface composition with respect to the bulk target composition due to the different sputtering yields for each component. When sputtering conditions are changed, a new surface composition must be achieved to obtain a steady state transfer of the target composition.

The sputter deposited barium ferrite film is initially nonmagnetic, insulating, amorphous and extremely stable in air. Crystalline magnetic films are obtained by annealing the samples after removal from the sputtering system. Annealing is performed using a quartz lamp rapid thermal annealing oven or by similar techniques as are known in the art. A typical annealing condition is 850° C. for 10 minutes in one atmosphere of O$_2$. Processing times as short as 10 seconds are possible for annealing temperatures of 950° C. Additionally, crystalline films can be obtained at temperatures below 800° C. if annealing time is increased to several hours. If the films are deposited on SiO$_2$ or other compatible substrates, the temperature at which annealing occurs has very little impact on the magnetic properties of the resultant crystalline barium ferrite films.

Unlike films annealed in O$_2$, films annealed in N$_2$ show a substantial dependence of their magnetic properties on the time and temperature of the anneal. Films annealed in N$_2$ for more than 20 minutes at 900° C. have a sharply reduced coercivity. Studies performed using Rutherford back-scattering spectroscopy (RBS) reveal that high temperature annealing in an N$_2$ atmosphere for a long period of time reduces the oxygen content of the barium ferrite film when compared to films identically annealed in O$_2$.

Alternatively, the amorphous barium ferrite film may be annealed by laser irradiation. Laser irradiation has the advantage of minimizing damage to the substrate material caused by exposure to high temperature annealing in ovens. In addition, laser crystallization of the barium ferrite film makes it possible to form magnetic regions on a recording medium while leaving adjacent portions of the medium nonmagnetic. For example, data tracks on a magnetic recording disk could be crystallized while leaving adjacent bands nonmagnetic. This results in a high degree of desirable magnetic isolation between adjacent data tracks.

In one embodiment of the laser annealing process, light from a Coherent General E7000 $CO_2$ laser operating in CW mode at a wavelength of 10.6 microns is directed through a series of ZnSe or other suitable lenses toward a barium ferrite thin film on a $SiO_2$ substrate. The defocused beam from the laser is used to irradiate a circular metal aperture which is focused on the sample at a normal incidence so as to form a 6.4 mm radius circle. The irradiation is performed in air at ambient pressure and temperature for 5 to 80 seconds with the laser operating at 100 to 300 watts.

Many variations of the above described process are possible. For example, the laser may be a Nd—YAG, excimer, or pulsed ruby laser, as long as it can deliver the requisite energy and couple the energy to the film. As an example, the above described procedure was used with an XeCl excimer laser operating at 308 nm to successfully anneal barium ferrite films on common glass substrates with no thermal damage to the glass.

Figure 7A:
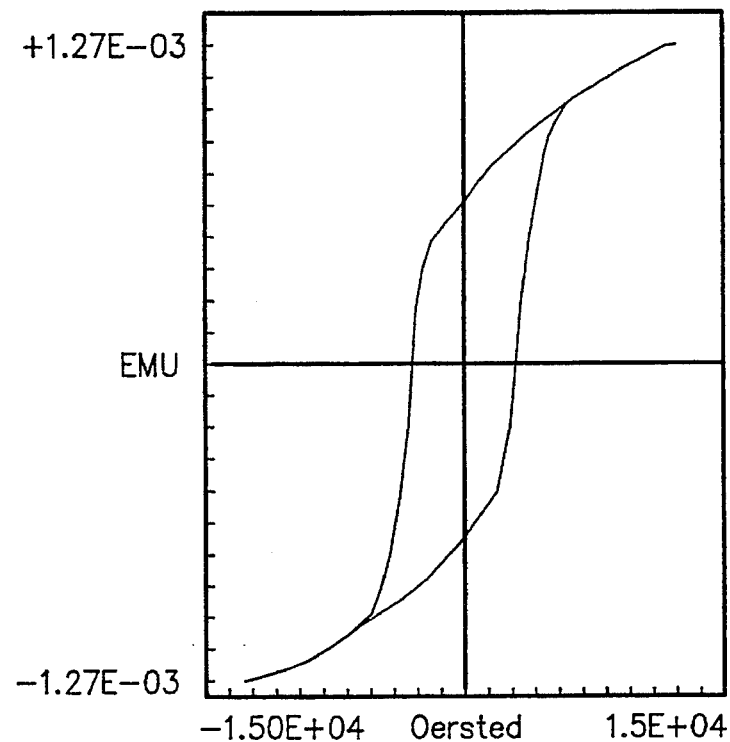
FIG. 7A is a hysteresis loop of a barium ferrite film annealed by CO$_2$ laser irradiation.
Figure 7B:
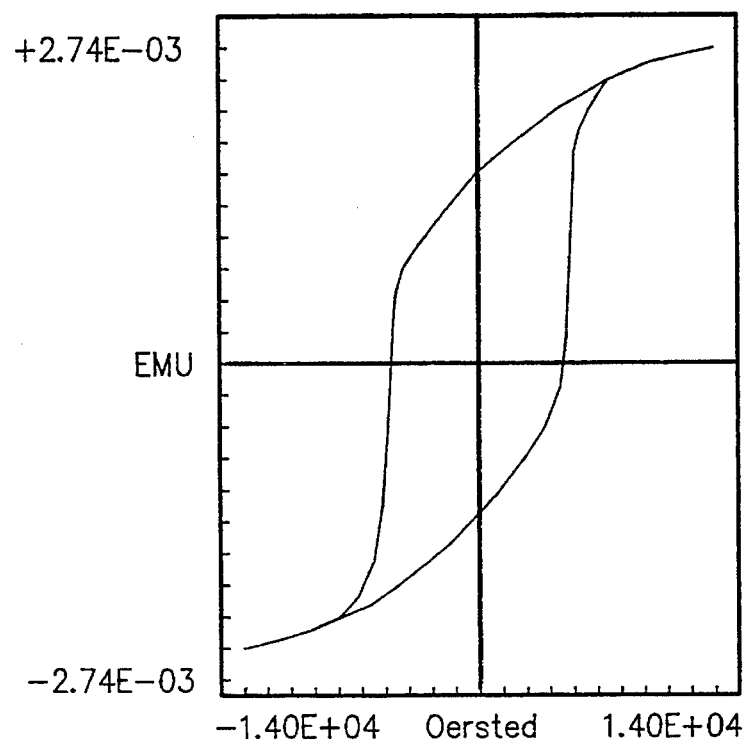
FIG. 7B is a hysteresis loop of a high coercivity barium ferrite film annealed by CO$_2$ laser irradiation.

Referring now to FIG. 7A, the hysteresis loop of an 800 Å barium ferrite film deposited on an $SiO_2$ substrate and annealed by $CO_2$ laser irradiation at 300 watts for 5 seconds exhibits a coercivity of 3500 Oe and an S* of 0.75. Similarly, FIG. 7B is the hysteresis loop of an 800 Å barium ferrite film doped with 0.03 atomic percent of chromium and annealed by $CO_2$ laser irradiation for 5 seconds. The in-plane coercivity of this film is slightly greater than 5000 Oe.

Figure 8B:
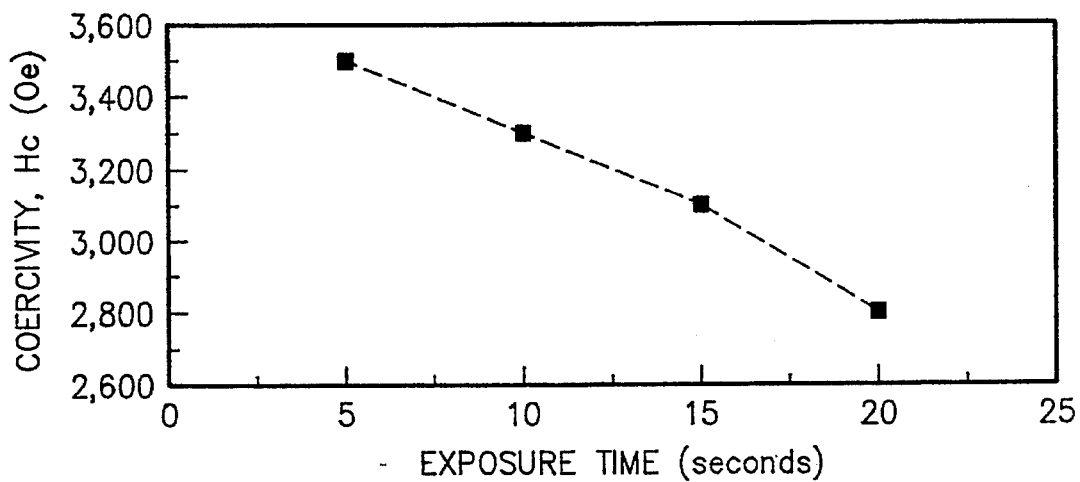
FIG. 8B is a graph illustrating the relationship between laser irradiation time and coercivity at a laser power of 110 watts.
Figure 8A:
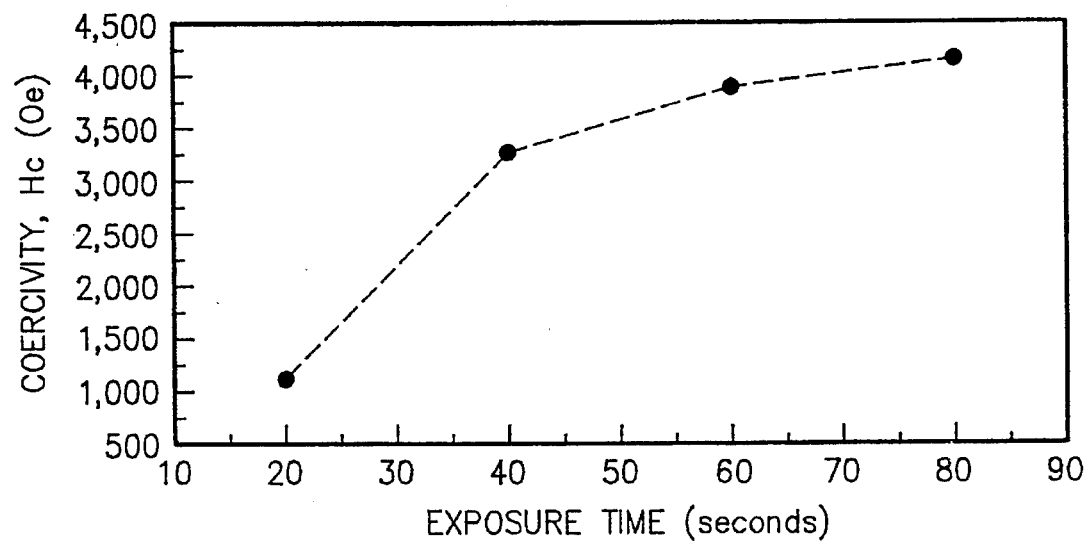
FIG. 8A is a graph illustrating the relationship between laser irradiation time and coercivity at a laser power of 300 watts.

The relationship between laser irradiation time and film coercivity is illustrated in FIG. 8A and 8B. FIG. 8A is a graph of coercivity vs. laser exposure time for an amorphous 800 Å barium ferrite film subjected to irradiation at a power of 110 watts. As is clear from the graph, increasing irradiation time results in higher coercivity films at this power level. FIG. 8B is a similar graph for a laser operating at 300 watts. At this power level, coercivity drops substantially as irradiation times exceed 5 seconds. It is believed that these power levels lead to localized heating of the substrate and thereby promote a reaction between the barium ferrite film and the substrate that results in a nonmagnetic material at the interface.

The substrate on which the barium ferrite thin film is deposited must be able to withstand the high temperature oven annealing process or, at a minimum, the temperatures experienced during laser irradiation. In addition, it is desirable that the substrate be relatively unreactive with the barium ferrite film. Substrates meeting these criteria include: oxidized silicon; $SiO_2$ (fused silica or fused quartz glass); and Corning glass #7913 (Vycor 96% silica sheet glass). Other substrates are useful with the present invention but may require a buffer layer between the film and substrate to prevent a reaction at the interface 67. However, substrate film reactions are often reproducible and may promote adhesion between the film and the substrate. These results are summarized in Table II. Substrate reactivity is determined by the amount of film-substrate interdiffusion that occurs after high temperature annealing. Significant interdiffusion typically results in films having poor magnetic properties and little crystallinity. "Small" reactivity implies barium ferrite crystals with good magnetic properties, while "large" reactivity corresponds to films having poor magnetic properties, little crystallinity, and significant interdiffusion between the substrate and a 1000 Å thick film. Adhesion was determined by a qualitative scratch test with stainless steel tweezers.

TABLE II

Ba-ferrite thin film substrates

| Substrates | Description | Reactivity | Adhesion |
| --- | --- | --- | --- |
| fused silica | $SiO_2$ glass | small | good |
| fused quartz | $SiO_2$ glass | small | good |
| 7913 glass | 96% $SiO_2$ glass | small | good |
| 7059 glass | alkali free glass | medium | good |
| 0317 glass | soda glass | medium | good |
| oxidized Si | $SiO_2$ glass | small | excellent |
| UDAC | C glass | very large | very poor |
| Si | cubic, (100) (111) | large | good |
| $Al_2O_3$ | hex., A, R, C, plane | small | good |
| MgO | cubic, (100) | large | good |
| $Y_2O_3$—$ZrO_2$ | cubic, (100) | very small | poor |
| $LaAlO_3$ | cubic, (100) | very small | poor |
| $SrTiO_3$ | cubic, (100) | very small | very poor |

Figure 2A:
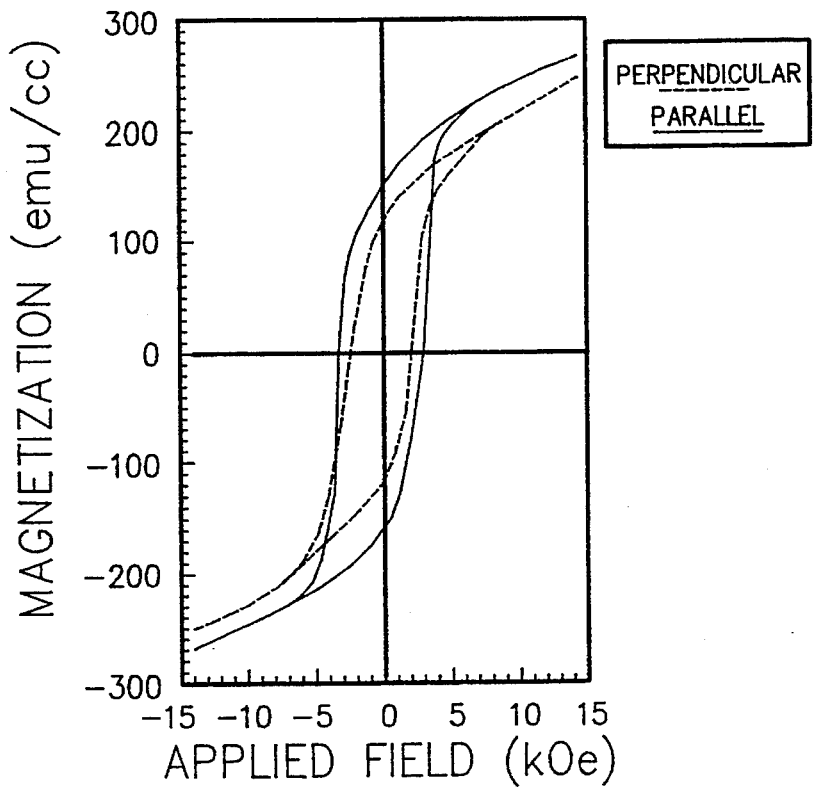
FIG. 2A is a magnetic hysteresis loop of an 850 Å barium ferrite thin film of moderate coercivity with the applied field in the plane of the film.
Figure 2B:
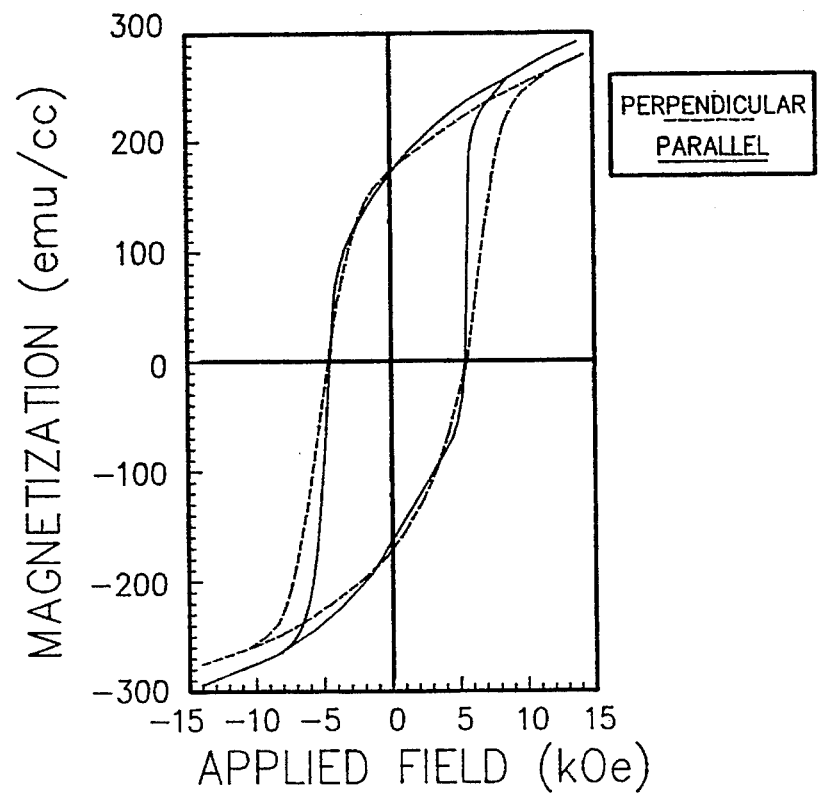
FIG. 2B is a magnetic hysteresis loop of an 850 Å barium ferrite thin film of large coercivity with the applied field in the plane of the film.

FIGS 2A and 2B are hysteresis loops of two barium ferrite films of moderate and large coercivity respectively in fields applied parallel and perpendicular to the substrate surface. The large crystal anisotropy of the barium ferrite M-phase prevents saturation of these films even in a field of 14 kOe. The comparable remanent moments of the two orientations suggests that no strongly preferred crystal orientation exists in the film. The saturation magnetization (H=20 kOe) of the sample in FIG. 2B ($M_s$=265 emu/cm$^3$) is approximately 71% of the typical bulk value of barium ferrite (375 emu/cm$^3$). It is presumed that the missing moment is the result of a nonmagnetic reaction layer at the substrate interface 67. The modest magnetization squareness of the in-plane hysteresis loop, typically between 0.45 and 0.60, is a consequence of the lack of orientation of the crystallites. The coercive squareness, typically in the range of 0.75 to 0.85, is quite large, implying a narrow switching field distribution. A narrow switching field distribution is a key requirement of a successful recording medium and an important advantage of the present invention.

Scanning electron microscope (SEM) micrographs reveal the surface of the barium ferrite film to consist of a collection of plate-like grains and needle-like grains with aspect ratios of approximately 8:1. Cross-sectional transmission electron microscope (TEM) studies reveal that these grains are columnar and extend all the way to the substrate. The needle-like grains are essentially plates when viewed edge-on. Contrary to the acicular particles found in most particulate recording media, the easy magnetization axis of a barium ferrite needle-shaped grain is parallel to the short dimension due to the large crystal anisotropy of the material.

Figure 3A:
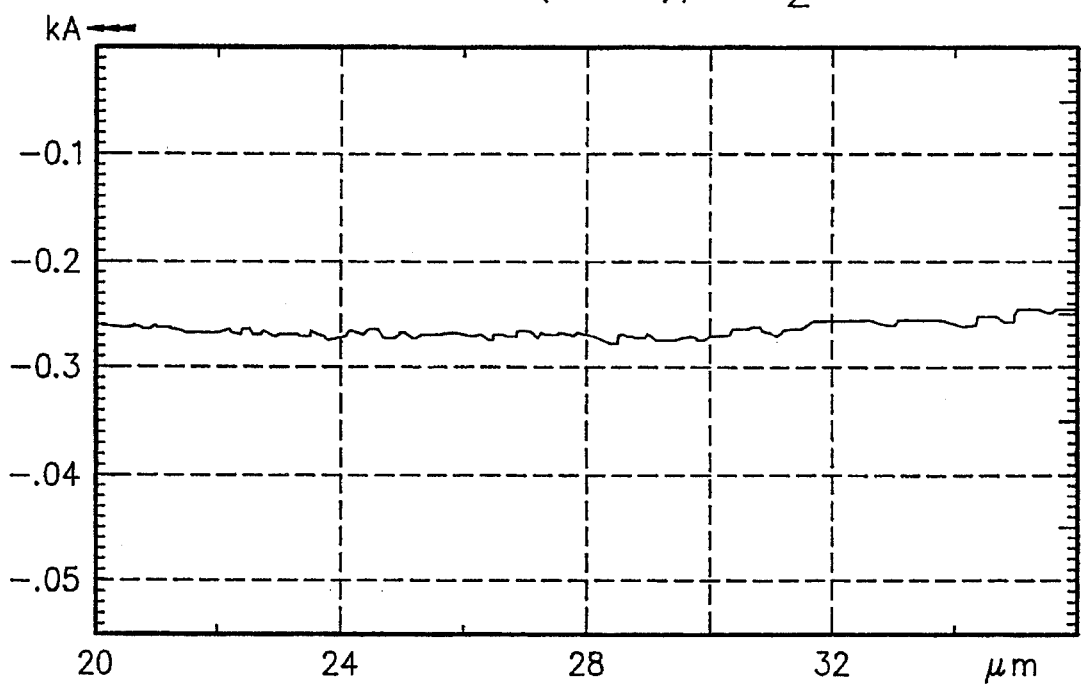
FIG. 3A is a profilometer scan of a 1,000 Å barium ferrite thin film after deposition.
Figure 3B:
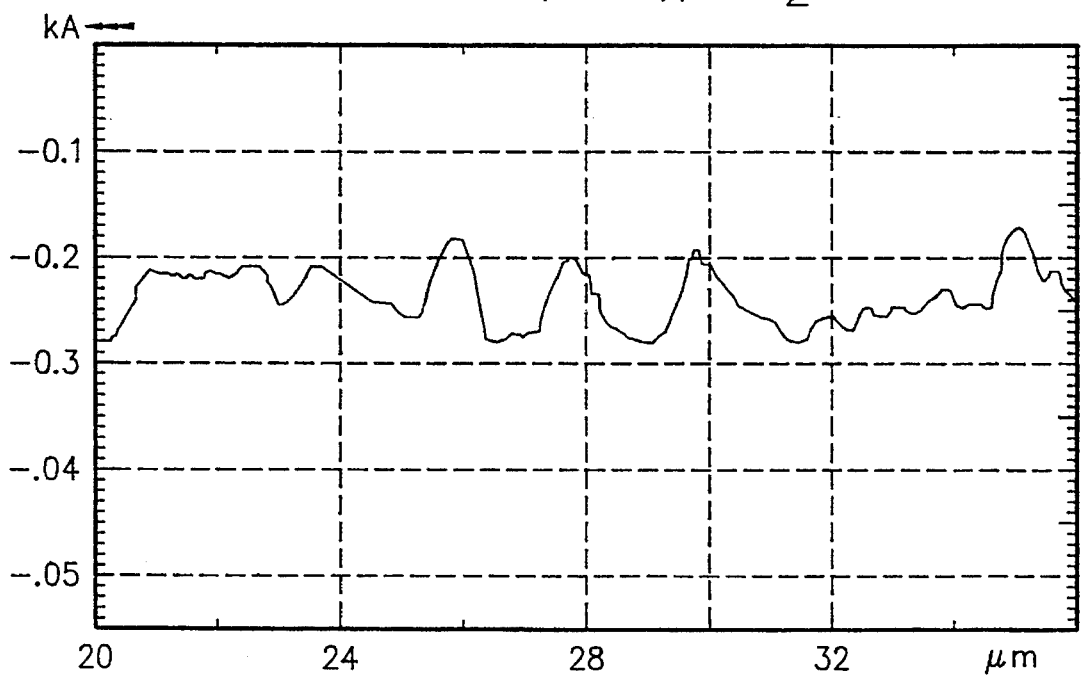
FIG. 3B is a profilometer scan of a 1,000 Å barium ferrite thin film after annealing.
Figure 4:
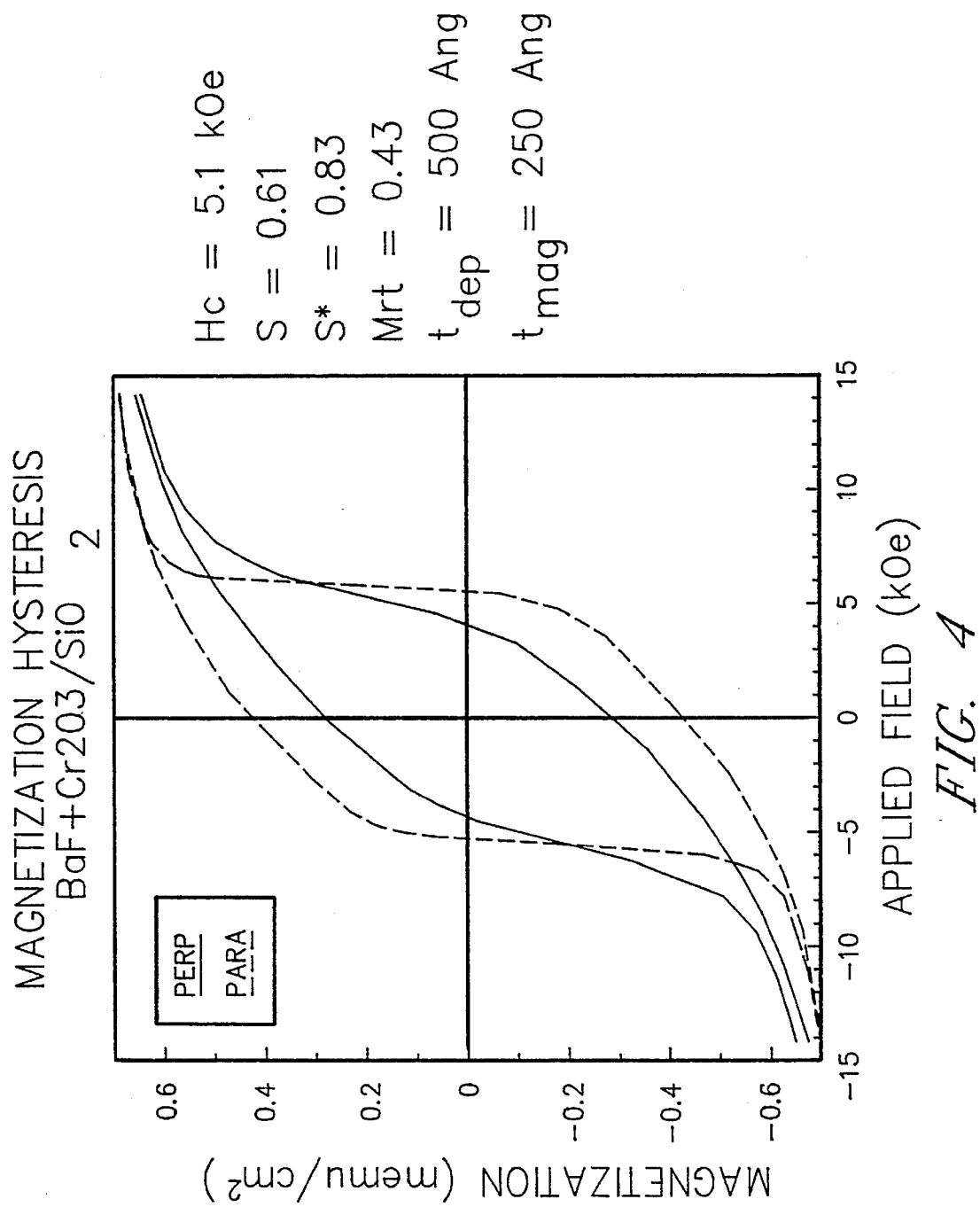
FIG. 4 is a magnetic hysteresis loop of a barium ferrite thin film doped with chromium oxide on an SiO$_2$ substrate.

The needle-like grains at the surface of the barium ferrite films provides an inherent texturing that is advantageous in many recording applications. Because the surface is textured, transducing heads and their attached air bearing sliders are less likely to bond to the surface. An illustration of the inherent texturing of the media is seen in FIG. 3A and 3B which are profilometer scans of 1000 Å barium ferrite films after deposition and annealing, respectively. As is apparent from the figures, the surface of the annealed film is much rougher than that of the amorphous film. This is due to the random crystal orientation of the film and the acicular particles extending to different heights above the film. It should be noted that the term "random orientation" as used above, denotes a broad range of crystalline structures varying from a complete 3-dimensional random orientation to those films having a preferential in-plane orientation and a random orientation within the plane of the film.

A strong correlation exists between grain size and barium ferrite composition ratio in films deposited on $SiO_2$ substrates. Grain size was determined by scanning electron microscope studies and the barium to iron ratio was determined using RBS data. Smaller grained films are obtained in films with a larger Ba—Fe ratio. The typical dimension of the needle-like grains in a small grained film is approximately 300–1500 Å, which approaches the dimensions of the grains found in cobalt-based alloy mediums today. Films thinner than 500 Å have small magnetic moments and exhibit little or no hysteresis. Presumably, this is the result of a reaction with the substrate.

Coercivity of barium ferrite materials is typically observed to increase with decreasing grain size until grain sizes become so small that thermally activated reversal effects become dominant. Magnetization reversal in barium ferrite particles and ceramics is generally believed to be due to the nucleation of regions of reversed magnetization at crystal and microstructural defects located at the edges of the grains or particles, followed by rapid propagation of the reversed region throughout the particle. Domain wall motion from grain to grain is not observed. The increase of coercivity with decrease of grain size is thought to be the result of a reduction in the number of defects per particle as particle size decreases. At very small particle size, coherent rotation may become the dominant mechanism responsible for magnetization reversal. As demonstrated in FIG. 5, a strong correlation exists between coercivity and grain size in barium ferrite thin films. The squareness values, S and S* are relatively insensitive to grain size.

Figure 5:
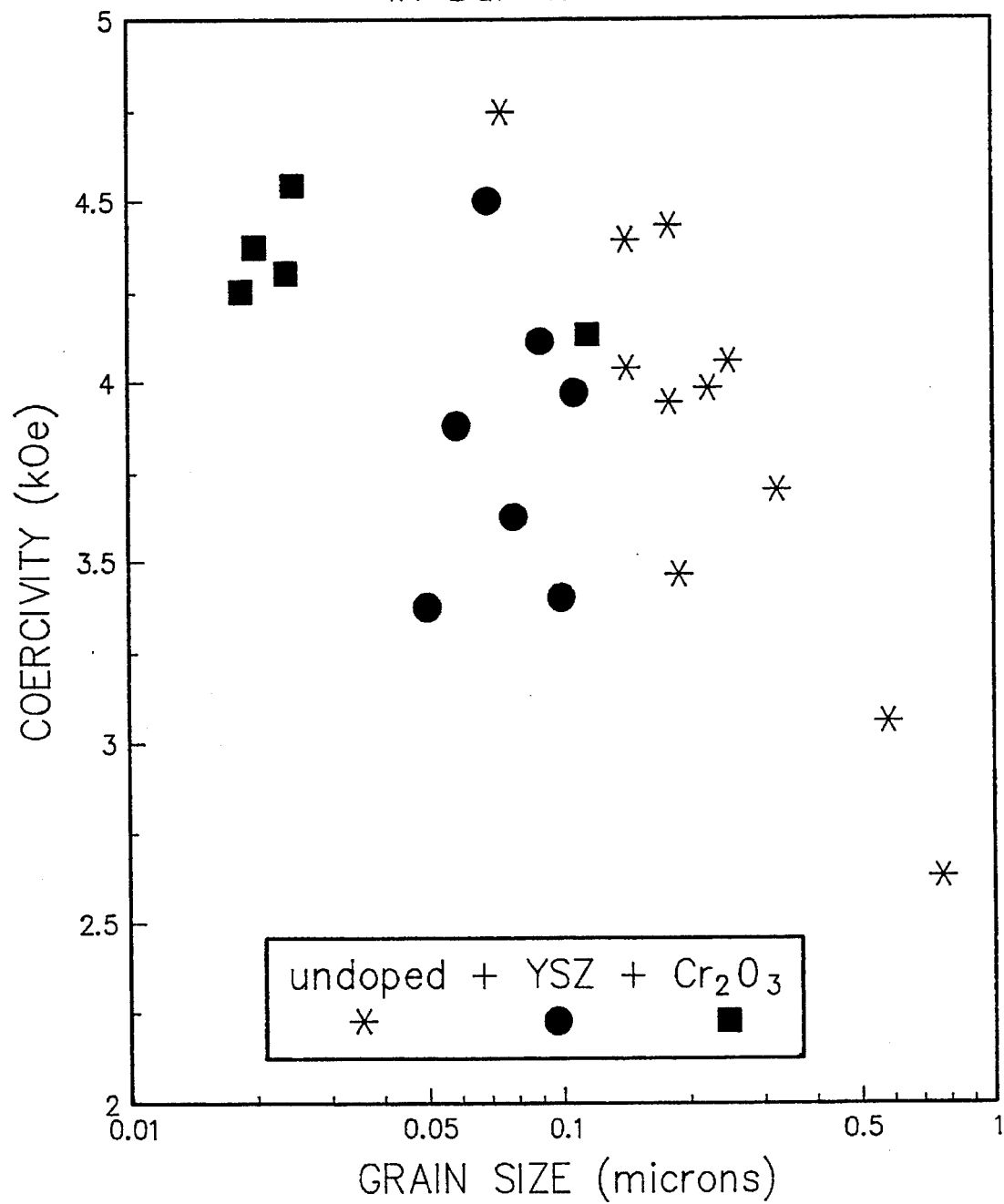
FIG. 5 is a graph illustrating the relationship between coercivity and grain size for various doped and undoped barium ferrite thin films.
Figure 6:
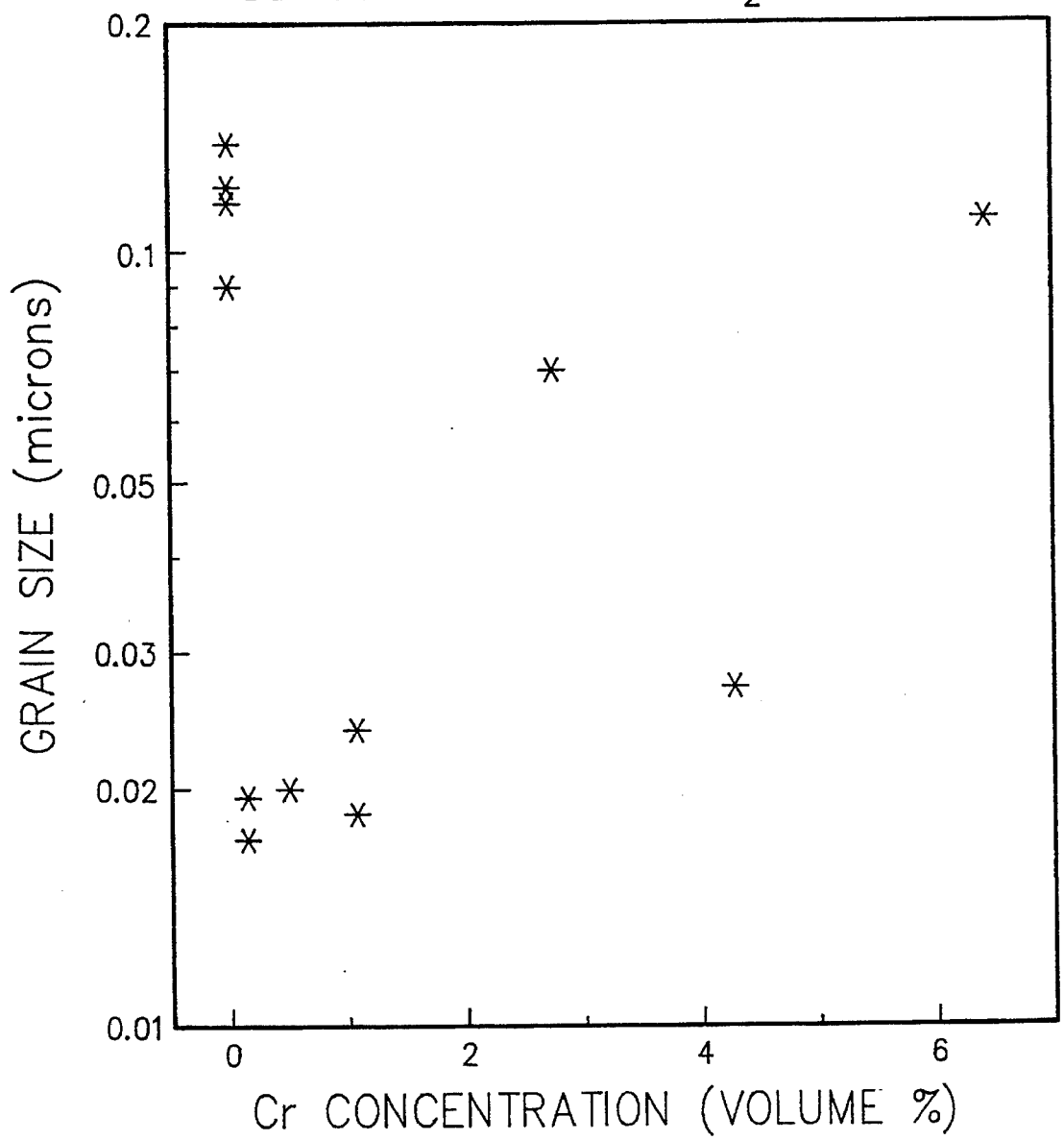
FIG. 6 is a graph illustrating the relationship between grain size and Cr$_2$O$_3$ doping concentration for barium ferrite thin films deposited on SiO$_2$ substrates.

The grain size of barium ferrite thin films can be controlled by doping the films with compounds such as $Cr_2O_3$, $SiO_2$, $TiO_2$, $ZrO_2$, $Y_2O_3$, $Y_2O_3.ZrO_2$ (YSZ), $Al_2O_3$, $CoO.TiO_2$ or other simple oxides having a metal cation with a valence of +or +4. Small grain films are essential for creating low-noise, high areal density recording media. FIG. 6 illustrates the relationship between grain size and dopant concentration for barium ferrite thin films doped from $Cr_2O_3$ targets. The films are deposited using sputtering apparatus as described above with a substrate rotating past a stationary $Cr_2O_3$ target and a stationary $BaFe_{12}O_{19}$ target. The concentration of chrome in the resultant film is controlled by adjusting the sputtering power applied to the target. The smallest grains are obtained in samples with chrome concentrations between 0.1% and 1% by volume. In addition to altering film grain size, doping also modifies the coercivity of the individual crystals within the film and may affect the preferential orientation of crystals within the film. Proper selection of dopants and doping concentrations can result in thin films having superior magnetic properties. As illustrated in FIGS. 5 and 6, grain sizes below 200 Å and in-plane coercivities above 4250 Oe can be achieved by doping with $Cr_2O_3$ at a concentration of 0.1 to 1%

Films made in accordance with the present invention exhibit excellent contact-start-stop durability. A contact-start-stop test performed on a lubricated barium ferrite disk without an overcoat exhibited an average stiction force of approximately 5 grams after more than 30,000 cycles. At the conclusion of the test, the disk exhibited no sign of wear or debris. In addition, films made in accordance with the present invention exhibit no significant corrosion. This is to be expected given the well-known stability of the M—Ba phase in a variety of environments. Finally, the films are extremely durable as demonstrated by a hardness value of 16 GPa as determined by nanoindentation tests.

Figure 9:
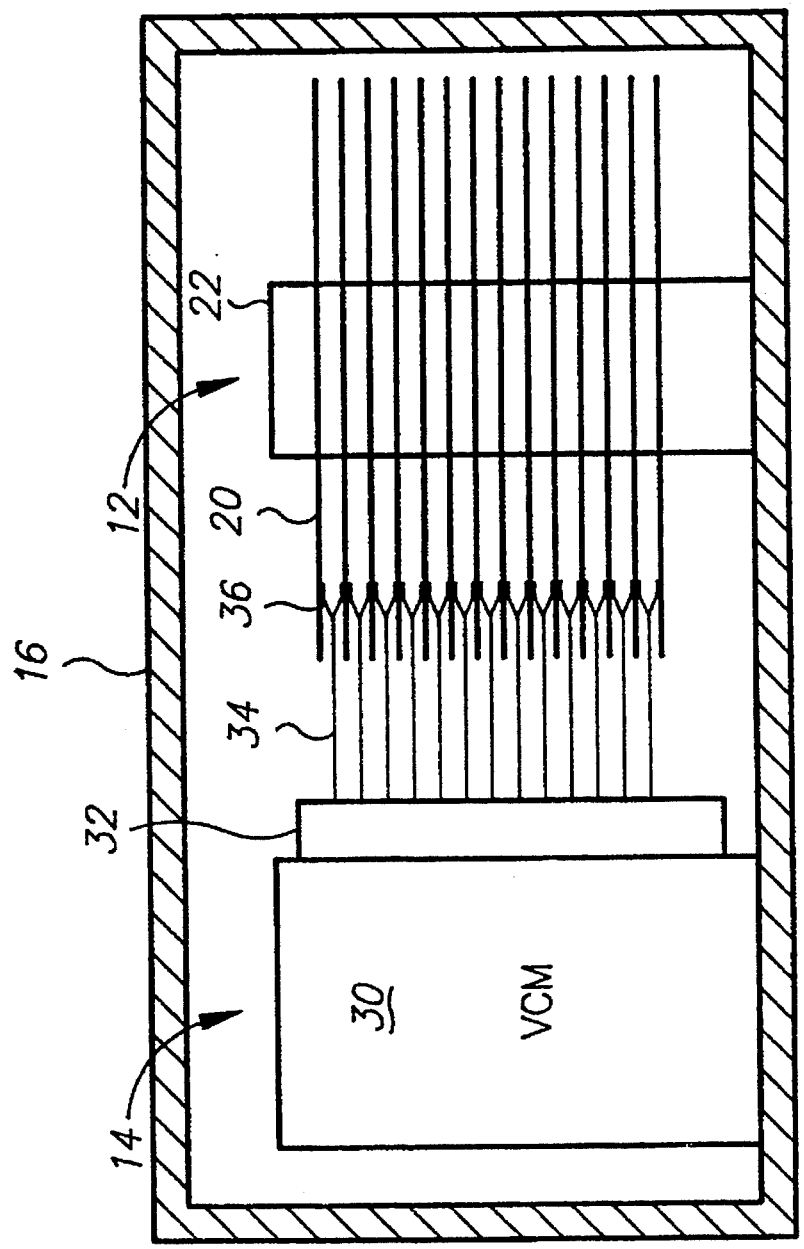
FIG. 9 is a schematic diagram of a disk drive system useful for practicing the present invention.

A preferred embodiment of the present invention utilizes a barium ferrite thin film on the surfaces of disks in a magnetic recording disk drive. With reference to FIG.9, a schematic diagram of a magnetic recording disk drive is illustrated and is designated by the general reference number 10. System 10 comprises a disk spindle assembly 12 and a head actuator assembly 14. Spindle assembly 12 and head actuator assembly 14 are located within a sealed housing 16 to prevent particulate contamination. Spindle assembly 12 comprises a plurality of magnetic recording disks 20 which are mounted to a spindle 22. Spindle 22 is rotated by an in-hub electrical motor which is not illustrated. Head actuator assembly 14 comprises a voice coil motor 30 which moves an actuator arm assembly 32 relative to the disks 20. Assembly 32 has a plurality of actuator arms 34, each of which is positioned in a space between two adjacent disks 20. Each actuator arm 34 has a pair of read/write heads 36. One head reads the disk positioned above the actuator arm 34 and the other reads the disk positioned below the actuator arm 34.

In operation, spindle 22 is rotated by the in-hub motor and motor 30 moves the actuator arms 34 between the disks 20 to the desired track location. One of the read/write transducers 36 then reads or writes data on the desired track.

Figure 10:
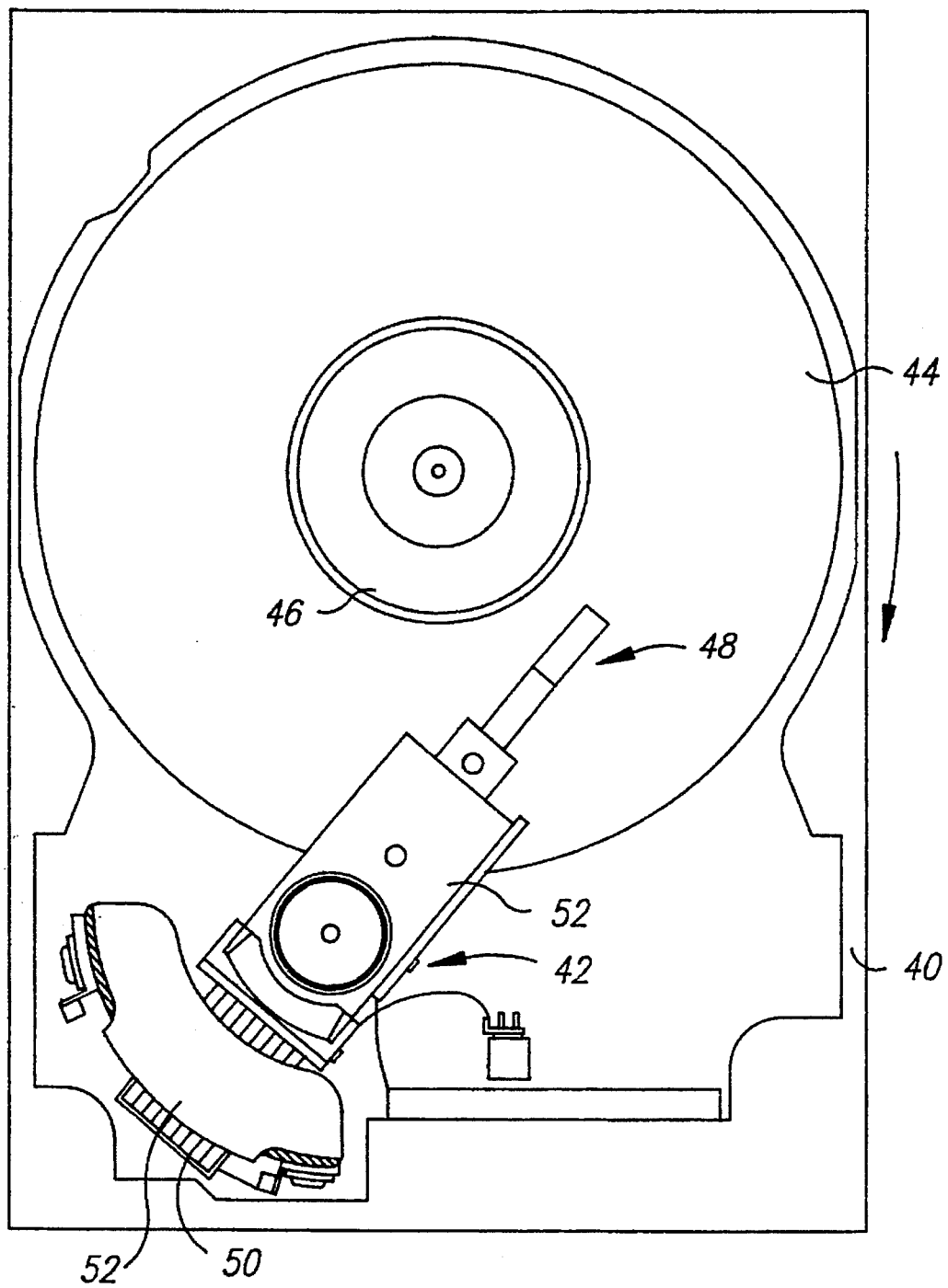
FIG. 10 is a top plan view of a disk drive system useful for practicing the present invention.

Referring now to FIG. 10, a data recording disk drive useful for practicing the present invention is illustrated. The disk file includes a housing 40 in which is mounted a rotary actuator 42, an associated disk 44 and a drive means 46 for rotating the disk 44. The rotary actuator 42 moves a suspension assembly 48 in an arcuate path over the disk 44. The rotary actuator 42 includes a voice coil motor, which comprises a coil 50 movable within the magnetic field of a fixed permanent magnet assembly 52. An actuator arm 54 is attached to the movable coil 50. The other end of the actuator arm 54 is attached to the transducer-suspension assembly 48.

In the preferred embodiment, the disk 44 comprises a $SiO_2$ substrate on which is formed a 400 Å barium ferrite film made in accordance with the present invention. The film is doped from $Cr_2O_3$ targets with 1% by volume of $Cr_2O_3$ and annealed at 850° C. for 10 minutes in air.

The previously described embodiments of the invention have many advantages in addition to their high in-plane remanence and inherent texturing. As mentioned above, films made in accordance with the present invention comprise small, magnetically decoupled grains. This results in a recording medium that is useful for high density recording and has a high signal to noise ratio. In addition, the present invention has several advantages over traditional cobalt-based recording mediums. First, barium ferrite sputtering targets are relatively inexpensive when compared to cobalt alloy targets, especially if the cobalt is alloyed with platinum. Second, the medium is very corrosion resistant and wear resistant. Therefore, no protective or lubricating overcoat is required on the surface of the medium or on the surface of the slider carrying the read/write head. This allows a read/write head to fly closer to the magnetically active portion of the recording medium and allows a higher recording density. Finally, unlike cobalt based recording mediums that often require undercoats or a layered structure to achieve satisfactory magnetic performance, a barium ferrite film made in accordance with the present invention achieves satisfactory performance with only a single layer deposition. Therefore, the medium is easier to manufacture and less expensive than traditional cobalt-based alloys.

Although the present invention has been described in considerable detail with reference to certain preferred versions thereof, other versions are possible. For example, although the invention has been described in combination with specific substrate materials, one skilled in the art could apply the present invention to other substrates. Similarly, one skilled in the art would realize that the teachings of the present invention with respect to $BaFe_{12}O_{19}$ can be applied to the almost chemically identical material $SrFe_{12}O_{19}$. It should be apparent that other modifications and adaptations of the described embodiments may occur to one skilled in the art without departing from the scope of the present invention as set forth in the following claims.

We claim:

1. A thin film magnetic recording medium comprising:
   a substrate; and
   a barium ferrite film formed on the substrate having a randomly oriented crystalline structure and an in-plane coercivity greater than 5000 Oe, said film comprising $BaFe_{12}O_{19}$ doped with $Cr_2O_3$ wherein said barium ferrite film has an average grain size less than 300 Å.

2. The thin film magnetic recording medium of claim 1 wherein chrome comprises 0.1 to 1 percent by volume of said barium ferrite film.

3. A thin film magnetic recording medium comprising:
   a substrate; and
   a barium ferrite film on said substrate having a randomly oriented crystalline structure, an in-plane coercivity greater than 2000 Oe and a grain size less than 300 Å wherein said barium ferrite film comprises $BaFe_{12}O_{19}$ doped with $Cr_2O_3$.

4. The thin film magnetic recording medium of claim 3 wherein chrome comprises 0.1 to 1 percent by volume of said barium ferrite film.

5. The thin film magnetic recording medium of claim 3 wherein the surface of said barium ferrite film has a roughness exceeding 20 Å RMS.

6. A thin film magnetic recording medium comprising:
   a substrate; and
   a barium ferrite film on said substrate having a randomly oriented crystalline structure, an in-plane coercivity greater than 4000 Oe, and a grain size less than 200 Å, said film comprising $BaFe_{12}O_{19}$ doped with $Cr_2O_3$.

7. A thin film magnetic recording medium comprising:
   a substrate; and
   a barium ferrite film on said substrate having a randomly oriented crystalline structure, an in-plane coercivity greater than 3250 Oe, and a grain size less than 700 Å, said film comprising $BaFe_{12}O_{19}$ doped with $Y_2O_3 \cdot ZrO_2$.

* * * * *